(12) United States Patent
Bertolet et al.

(10) Patent No.: US 6,204,074 B1
(45) Date of Patent: *Mar. 20, 2001

(54) CHIP DESIGN PROCESS FOR WIRE BOND AND FLIP-CHIP PACKAGE

(75) Inventors: Allan Bertolet, Williston; James Fiore; Eberhard Gramatzki, both of Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/895,542

(22) Filed: Jul. 17, 1997

Related U.S. Application Data

(63) Continuation of application No. 08/574,711, filed on Dec. 21, 1995, now abandoned, and a continuation-in-part of application No. 08/370,278, filed on Jan. 9, 1995, now Pat. No. 5,517,127.

(51) Int. Cl.⁷ .......................... H01L 21/66; H01L 21/44; G01R 31/26
(52) U.S. Cl. .............................. 438/18; 438/611; 438/613
(58) Field of Search .............................. 438/613, 18, 611, 438/FOR 342, FOR 343

(56) References Cited

U.S. PATENT DOCUMENTS

| | | | |
|---|---|---|---|
| 3,380,155 | * 4/1968 | Burke . | |
| 3,812,521 | 5/1974 | Davis et al. | 397/48 |
| 4,087,314 | * 5/1978 | George et al. | 437/183 |
| 4,154,877 | * 5/1979 | Vratny . | |
| 4,447,857 | 5/1984 | Marks et al. | 361/395 |
| 4,792,532 | * 12/1988 | Ohtani et al. | 437/206 |
| 4,845,354 | * 7/1989 | Gupta et al. . | |
| 4,948,754 | * 8/1990 | Kondo et al. | 437/183 |
| 5,010,389 | * 4/1991 | Gansauge et al. . | |
| 5,036,163 | 7/1991 | Spielberger et al. | 174/52.4 |

(List continued on next page.)

FOREIGN PATENT DOCUMENTS

| | | | |
|---|---|---|---|
| 57-122542 | * 7/1982 | (JP) . | |
| 58-15251 | * 1/1983 | (JP) | 437/183 |
| 59-35437 | * 2/1984 | (JP) | 437/209 |
| 339871 | * 4/1989 | (JP) . | |
| 4201792 | * 1/1992 | (JP) . | |

OTHER PUBLICATIONS

Bona et al., "Optical Networks for VLSI–Interconnects on Flexible GaAs Substrate", *IBM Technical Disclosure Bulletin*, vol. 35, No. 2, pp. 26–27, (Jul. 1992).

* cited by examiner

Primary Examiner—David E. Graybill
(74) Attorney, Agent, or Firm—Heslin & Rothenberg, P.C.

(57) ABSTRACT

A method of fabrication are provided in which permanent external electrical connection to active circuitry in a semiconductor structure can be made through either a wire bond pad or metal bump formed thereon. A final metallization including a wire bond pad is disposed over and electrically connected with the active circuitry. An insulating material film is disposed over the final metallization leaving the wire bond pad and a portion of the final metallization laterally displaced from the pad exposed. A metal bump contacts the laterally displayed exposed portion of the final metallization. The wire bond pad is electrically coupled with and laterally displaced from the metal bump through the final metallization. The metal bump and wire bond pad are configured to facilitate electrical connection of the semiconductor structure with an external connector, such as a modular packaging substrate. The structure may also be used for testing and burning in a semiconductor die without direct physical contact of the external testing device to the wire bond pad.

20 Claims, 6 Drawing Sheets

U.S. PATENT DOCUMENTS

| | | | |
|---|---|---|---|
| 5,187,020 | * | 2/1993 | Kwon et al. .......................... 428/601 |
| 5,281,684 | | 1/1994 | Moore et al. ........................... 427/96 |
| 5,289,631 | | 3/1994 | Koopman et al. ..................... 29/840 |
| 5,299,729 | * | 4/1994 | Matsushita et al. ............ 228/180.22 |
| 5,306,664 | * | 4/1994 | Sakura . |
| 5,354,955 | | 10/1994 | Gregor et al. ........................ 174/250 |
| 5,436,197 | * | 7/1995 | Hause ..................................... 437/183 |
| 5,451,715 | * | 9/1995 | Hundt et al. ........................ 174/52.4 |
| 5,480,834 | * | 1/1996 | Lake et al. ............................ 437/183 |
| 5,504,036 | * | 4/1996 | Dekker et al. ....................... 437/183 |
| 5,517,127 | | 5/1996 | Bergeron et al. .................... 324/760 |
| 5,541,524 | * | 7/1996 | Tuckerman et al. ................. 324/754 |
| 5,559,054 | * | 9/1996 | Adamjee . |

CHIP DESIGN PROCESS FOR WIRE BOND AND FLIP-CHIP PACKAGE

CROSS-REFERENCE TO RELATED APPLICATION

This application is a continuation of application Ser. No. 08/574,711 filed Dec. 21, 1995, now abandoned, and a continuation-in-part of Ser. No. 08/370,278, filed Jan. 9, 1995, now U.S. Pat. No. 5,517,127.

TECHNICAL FIELD

The present invention generally relates to a structure and method for testing semiconductor wire bond dies, and more particularly, to a structure and method for burn-in and full functionality testing of semiconductor wire bond dies. The present invention also relates to a structure and method of fabrication that provides alternative connectors on a semiconductor die for external electrical connections to the active region of the die.

BACKGROUND ART

Full functionality testing is known to be carried out on semiconductor metal bump connect dies while the dies are still embodied in the silicon wafer. However, burn-in followed by the testing of semiconductor wire bond dies is generally not done at the wafer level because of inherent structural difficulties and the nature of making wire connections to external structures. Instead, burn-in and full testing of wire bond dies is generally done only after the dies have been severed from the wafer (chips) and packaged.

Typically, semiconductor wire bond dies defined on a semiconductor wafer undergo initial low-level DC testing wherein individual dies are tested for satisfactory operation. However, there are problems associated with this form of testing. External testing probes directly contacting wire bond pads can damage the wire bond pads by scratching or marking the pads such that subsequent wire bond electrical connection thereto can be difficult. In addition, electrical contact to wire bond pads may be unreliable when probe contacts must be maintained for any considerable length of time.

After DC testing, the wafer is severed between individual dies, inoperable dies are discarded, and operable dies (chips) are collected for packaging into a module. After packaging, burn-in and full functionality testing of each chip circuit is conducted under extended time and temperature conditions directed to assessing circuit reliability. If a particular wire bond chip is found inoperable after packaging, the entire module must often be discarded.

Efforts have been made to eliminate the need for two separate tests and to avoid damaging the surface of the wire bond pad. Such efforts have principally been directed toward constructing a method and structure for conducting wafer level burn-in and full functionality testing of wire bond dies. However, these methods generally require use of additional test structures and levels of interconnection in the kerf region of the wafer. Such structures typically must be removed before dicing the die from the wafer in order to prevent degradation of internal die circuitry performance. Another problem associated with the use of test structures formed in the kerf region is that the number of dies which can be defined on a wafer is limited by the amount of area the test structures require. In addition, the technology required for adding and removing temporary interconnections can contribute significantly to the wafer processing costs.

A need, therefore, continues to exist for an improved structure and method for achieving burn-in and fill functionality testing of a semiconductor wire bond die.

Current semiconductor packaging technology involves mounting chips on chip carriers like ceramic substrates or assembling the chips into plastic packages which provide the necessary pin input/output (I/O) connections. There are two principal systems for connecting chips to substrates. One system is termed the flip-chip bonding system, where metal bumps on the face of the chip are connected to metal pads formed on a chip carrier. This provides both mechanical bonding and electrical connections between the chip and carrier. The other system is a wire bonding system where wires, typically formed of aluminum or gold, are connected by ultrasonic bonding from wire bond pads on the chip to metal pads on a chip carrier or a lead frame (for plastic packages). The use of short wires from the substrate to the chip is desirable to avoid crossing. Thus, as a practical matter, wire bond pads are typically located around the periphery of a chip. In addition, this periphery location outside the region of integrated circuitry is advantageous because pressure applied to the pad during wire bonding won't damage the underlying circuitry. By contrast, metal bumps may be placed anywhere on the chip because wire bonding is not required. Thus, a greater number of electrical connections is possible to a chip using metal bumps than to a chip requiring wire bonding.

In a multi-package market manufacturers' inventory must include chips compatible with both bonding techniques so that either is available depending on whether wire bond or flip-chip/metal bump packaging is demanded. Dual design, manufacturing, and stocking processes increase the cost of chip production which in turn inflates the price of the chips in the market place.

If one chip having both metal bumps and wire bond pads facilitating electrical connection of the chip to either a wire bondable package or a flip-chip package could be produced, the cost of chip production would be significantly reduced because only one process would be necessary. This reduced production cost would then translate into a reduced selling price for semiconductor chips. A need therefore exists for a semiconductor structure and method of fabrication that provides a single chip design having both types of connectors therein for alternative external electrical connections thereto.

DISCLOSURE OF THE INVENTION

Briefly, in one aspect of the present invention, a structure is provided for facilitating electrical testing of a semiconductor wire bond die without direct physical contact of an external testing device to a wire bond pad of the die. The structure, which is disposed at an upper surface of the semiconductor wire bond die, comprises an electrical conductor having a solderable test contact. The solderable test contact, which is laterally displaced from the wire bond pad, is configured to facilitate electrical connection of an external testing or burn-in device thereto for electrical testing or burning in of the semiconductor wire bond die. The electrical conductor is disposed entirely in a region above the active circuitry of the semiconductor wire bond die and does not require removal after testing or burning in of the die.

In a more specific embodiment, the present invention provides a structure for facilitating the testing of or burning in a semiconductor wire bond die having an upper surface insulator with an aperture through which a wire bond pad is exposed. A conductive strap physically and electrically contacts the wire bond pad by covering an upper surface thereof. The conductive strap extends laterally from the wire bond pad above the upper surface insulator and connects with a solderable conductive test protrusion which is disposed thereon. The conductive strap and the solderable conductive test protrusion are disposed in a region above the active circuitry of the semiconductor wire bond die. The solderable conductive test protrusion is configured to facilitate connection of an external testing device thereto in order to allow electrical testing of the semiconductor wire bond die without direct physical contact of the external testing device to the wire bond pad. The solderable conductive test protrusion allows connection between the die and a high performance testing or burn-in device without affecting the surface of the wire bond pad.

In another aspect, the present invention provides a method for electrically testing a semiconductor wire bond die defined on a semiconductor wafer. The semiconductor wire bond die has a wire bond pad disposed at an upper surface thereof. The method includes forming an electrical conductor having a solderable test contact above the upper surface of the die and above the active circuitry of the die. The solderable test contact is laterally displaced from the wire bond pad and is configured to facilitate electrical testing of the die through contact with an electrical testing device. The electrical conductor includes an electrical interconnect portion which electrically connects the wire bond pad with the solderable test contact. The method also includes electrically connecting an external test connector to the solderable test contact, then electrically testing the semiconductor wire bond die using the external test connector without directly physically contacting the wire bond pad.

In another aspect of the present invention, a semiconductor structure is provided for facilitating external electrical connection thereto through either of two alternative connectors, a wire bond pad or a metal bump. The structure comprises a semiconductor substrate in which a region of active circuitry has been defined. Overlying the substrate is final metallization that is electrically connected with the active circuitry. A wire bond pad, which is configured to facilitate electrical connection with an external connector, is included in the final metallization. An insulating material film overlies the final metallization, but the wire bond pad is exposed through a contact hole therein. In addition, a via hole laterally displaced from the contact hole exists in the insulating material film exposing a portion of the final metallization that is laterally displaced from the wire bond pad. A metal bump, laterally displaced from the wire bond pad, resides in the via hole and contacts the exposed laterally displaced portion of the final metallization. The metal bump is electrically coupled with the wire bond pad through the final metallization and is configured to facilitate electrical connection with an external connector. Thus, electrical connection to the region of active circuitry in the semiconductor substrate can occur through either the wire bond pad or the metal bump.

Preferably, the metal bump comprises an aluminum bump, a solder ball, or a gold bump. To increase adherence, the metal bump may be partially disposed on the insulating material film adjacent the via hole. An adhesive conductive film is preferably interposed between the metal bump and the insulating material film and between the metal bump and the exposed portion of the final metallization that is laterally displaced from the wire bond pad. The adhesive conductive film facilitates adherence of the metal bump to the insulating material film and to the exposed final metallization. The adhesive conductive film preferably comprises a first layer of chromium or titanium, a layer of copper on the first layer, and a layer of gold on the copper layer.

The insulating material film is comprised preferably of an insulator such as silicon dioxide, silicon nitride, or polyimide. The insulating material film may include an underlying dielectric layer of silicon dioxide, silicon nitride, or polyimide with a final passivation layer on the dielectric layer comprised of a different one of the aforementioned insulators.

In a more specific embodiment, the present invention provides a structure for facilitating electrical connection of an external connector to a semiconductor die through a plurality of metal bumps and a plurality of wire bond pads on the die. A metallization level overlies a semiconductor substrate and is electrically coupled to a region of active circuitry therein. An inter-level dielectric layer having a plurality of grooves in an upper surface thereof overlies the metallization level, and an aperture exposing a portion of the underlying metallization level exists in at least two of the grooves. Each groove is spaced from all other grooves. A conductive metal fills the grooves and apertures forming a plurality of final metallization lines and a plurality of studs, respectively. Each final metallization line has a corresponding wire bond pad included therein defining a plurality of wire bond pads which are electrically coupled to the region of active circuitry through the corresponding final metallization lines and studs. Each wire bond pad is configured to facilitate electrical connection of an external connector. An insulating material film covers the final metallization lines, but each wire bond pad remains exposed through a corresponding contact hole. In addition, a plurality of via holes exist in the insulating material film. Each via hole is laterally displaced from a corresponding contact hole and exposes a portion of a corresponding underlying final metallization line that is laterally displaced from the corresponding wire bond pad. A metal bump is located in each via hole, thus contacting the corresponding final metallization line. Each metal bump is electrically coupled to a corresponding wire bond pad through the final metallization line and is also laterally displaced from the wire bond pad. Each metal bump is configured to facilitate electrical connection of an external connector thereto, such that electrical connection to the semiconductor substrate can occur through either the metal bumps or the wire bond pads.

In yet another aspect, the invention provides a structure facilitating the testing or burning in of a semiconductor die through an auxiliary testing terminal on the die. The semiconductor die includes a region of active circuitry and a final metallization overlying and electrically connected with the region of active circuitry. The wire bond pad is included in the final metallization. An insulating material film is disposed over the final metallization, but the wire bond pad is exposed through a contact hole in the insulating material film. A via hole laterally displaced from the contact hole is also defined in the insulating material film. The via hole exposes a portion of the final metallization that is laterally displaced from the wire bond pad. An auxiliary testing terminal in the via hole contacts the final metallization and is laterally displaced from and electrically coupled to the wire bond pad through the final metallization. The auxiliary testing terminal is configured to facilitate connection of an external test device thereto such that electrical testing of the semiconductor die can occur through the auxiliary testing terminal without direct physical contact of the external test device to the wire bond pad. The auxiliary testing terminal is preferably a metal bump.

In yet another aspect, the present invention provides a method for fabricating a semiconductor die configured to facilitate electrical connection of an external connector thereto through either a metal bump or a wire bond pad formed therein. The method includes: providing a semiconductor substrate with a region of active circuitry; forming a final metallization including a wire bond pad over the semiconductor substrate; forming an insulating material film over the final metallization; defining in the insulating material film a contact hole that exposes the wire bond pad and a via hole laterally displaced from the contact hole that exposes a portion of the final metallization laterally displaced from the wire bond pad; and forming a metal bump in the via hole that is laterally displaced from the wire bond pad and contacts the exposed final metallization. The wire bond pad and the metal bump are electrically coupled through the final metallization, and both are configured to facilitate electrical connection of an external connector. Thus, external electrical connection with the semiconductor substrate can occur through either the wire bond pad or the metal bump.

The method may also include electrically connecting an external test device to the metal bump, then electrically testing or burning in the semiconductor die using the external test device without direct physical contact of the external test device to the wire bond pad. The test device may then be removed, and the tested semiconductor die may be recovered after reshaping the metal bump.

To restate, the present invention satisfies the need for a structure and method for achieving burn-in and testing of individual semiconductor wire bond dies prior to modular packaging. The invention provides a structure for testing that is confined within the boundary of the semiconductor wire bond die, thereby eliminating use of the kerf area surrounding the wire bond die. The structure need not be removed from the die after testing but can remain on the die without impacting circuit performance or reliability. Also, because the kerf area is not used, the physical presence of the test structure is not a limiting factor in determining the number of semiconductor wire bond dies that can be defined on a wafer.

Another advantage of the present invention is that no direct physical contact is made to the wire bond pads by an external testing device. Thus, the wire bond pads remain undamaged from testing, and subsequent wire bond electrical connection thereto is facilitated. Further, the present invention provides a structure and method that obviate the conventional practice of utilizing a separate low-level method of testing the die using a probe, followed by burn-in and full functionality testing after severance and packaging. Currently, use of expensive test probes limits the minimum size of the die because the wire bond pads must be spaced far enough apart to prevent probe damage. Because probe testing on the wire bond pad is eliminated in accordance with the invention, wire bond dies can be fabricated in a smaller size.

The structure and method for testing presented herein are economically beneficial because losses incurred due to discarded defective multi-chip modules can be eliminated. Finally, a savings to the semiconductor chip manufacturer and ultimately to the consumer can be realized because a greater number of dies can be defined on a wafer due to smaller die size and more efficient use of the kerf area surrounding the dies.

The present invention also satisfies the need for a semiconductor structure and method of fabrication in which external electrical connections to the active region thereof can be made through either of two types of connectors formed thereon: wire bond pads or metal bumps. The method eliminates the need for two separate die production processes: one to produce wire bond dies; the other to produce dies having metal bumps. Thus, chip design, manufacturing and inventory cost can be reduced, and the savings can be passed to the consumer. In addition, because only one chip design needs to be produced and stocked, the time required to supply chips to consumers for multiple chip packaging is reduced.

The advantages listed above with respect to the structure and method for testing a semiconductor wire bond die apply equally well to the structure and method of fabrication of the present invention providing both a wire bond pad and a metal bump for alternative external electrical connection. One wafer test set up is eliminated because the dies on the wafer are tested exclusively by making external connections to the auxiliary testing terminal or metal bump contained thereon. Thus, the need for wafer testing via probes contacting wire bond pads is no longer necessary, so the wire bond pads remain undamaged which results in a yield improvement. Strong wire bonds with the pads can be made providing satisfactory electrical connections between the chip and wire bondable packages.

BRIEF DESCRIPTION OF THE DRAWINGS

These, and other objects, features and advantages of this invention will be more readily understood from the following detailed description of the various aspects of the invention taken in conjunction with the accompanying drawings in which.

BEST MODE FOR CARRYING OUT THE INVENTION

As noted, the present invention provides a structure and method for achieving burn-in and testing of a semiconductor wire bond die. In particular, a new contact point for facilitating electrical testing of the die's integrated circuitry is created above the active region of the die to replace use of the wire bond pads for testing. Thus, no direct physical contact of an external testing device is made to the wire bond pads of the die during testing or burn-in, and the problem of damage thereto is eliminated. The test contact points and electrical connections between the contact points and the die circuitry through the wire bond pads remain on the die after testing or burn-in. Thus, if the tested die is defined on a wafer, subsequent dicing may be done without removing the structure and without impacting circuitry performance.

In addition, the invention provides a semiconductor structure and method of fabrication in which two connectors are formed for making alternative electrical connections with an external electrical connector. Both a wire bond pad and a metal bump are provided over a semiconductor substrate having a region of active circuitry included therein. The wire bond pad and metal bump are electrically coupled through a final metallization overlying and electrically connected with the active circuitry of the semiconductor substrate. The wire bond is formed in the final metallization, and the metal bump laterally displaced from the wire bond pad resides on a laterally displaced portion of the final metallization. Both the wire bond pad and the metal bump are configured to facilitate electrical connection with an external connector. Thus, either may be used when joining the semiconductor structure with an external electrical connector.

Figure 1:
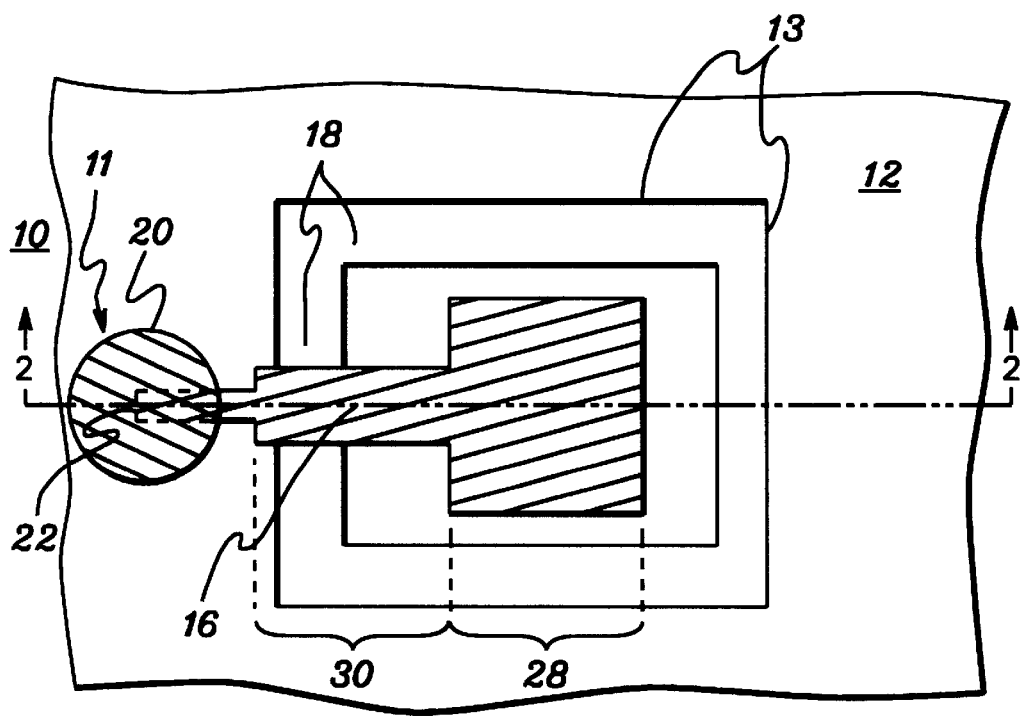
FIG. 1 is a top plan view of a portion of an individual semiconductor wire bond die illustrating the preferred additive test structure of the invention.
Figure 2:
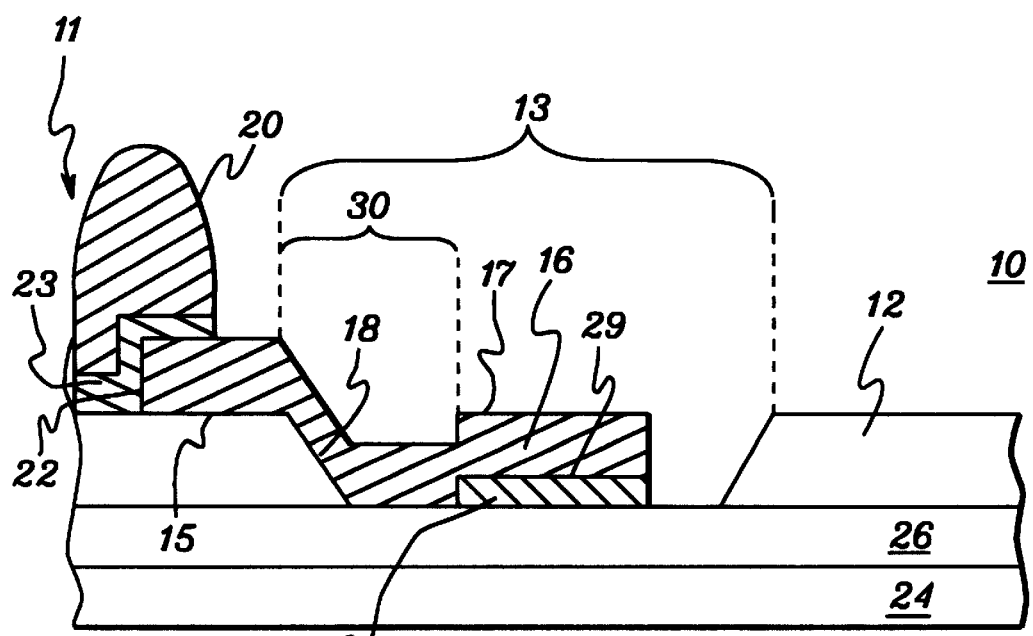
FIG. 2 is a cross section of the structure of FIG. 1 taken along lines A—A.

Referring to the drawings, FIG. 1 is a top plan view of a portion 10 of an individual semiconductor wire bond die illustrating one embodiment of an additive test structure 11 (shaded region) in accordance with the present invention, shown in relation to a single wire bond pad 28 (FIG. 2) of the die 10. Portion 10 is entirely disposed above the active integrated circuitry of the die. Additive test structure 11 includes a conductive strap 16 and a solderable test protrusion 20. As shown in FIG. 2, wire bond pad 28 resides directly beneath conductive strap 16.

"Conductive strap" is used herein to include any electrical conductor and is preferably a conductive metal layer compatible with wire bonding disposed on the semiconductor wire bond die. "Solderable" is used herein to refer to a metal capable of being joined with other metals using a melted metal alloy such as tin and lead. "Solderable test protrusion" is used herein to refer to a solderable conductive test contact on the die, which is preferably a protruding solderable conductive metal configured to facilitate electrical connection to an external connector such as a high performance testing or burn-in device. A bump such as a gold bump, aluminum bump, or solder ball comprised of lead and tin is preferred, and a controlled collapse chip connect (C4) type solder ball comprising lead and tin may be used.

Final passivation layer 12, which generally covers the entire top surface of the processed semiconductor wafer, serves to protect and insulate individual dies from damage during packaging and probe testing. Layer 12 may comprise a dielectric material such as a polyimide, silicon dioxide, or silicon nitride. Structure 11 is shown disposed on final passivation layer 12, but the structure is not limited to being directly thereon, and the term "final passivation layer" as used herein includes any upper surface insulator of the semiconductor wire bond die.

An aperture 13 in passivation layer 12 traditionally exposes upper surface 29 of wire bond pad 28, and final passivation layer 12 has a sloped upper surface 18 bordering aperture 13. As shown in the FIGS. 1 and 2, passivation layer 12 does not reach wire bond pad 28. However, passivation layer 12 may contact wire bond 28, and other configurations of passivation layer 12 with respect to wire bond pad 28 will be obvious to those skilled in the art.

Conductive strap 16 electrically interconnects wire bond pad 28 and solderable test protrusion 20 such that external testing of the semiconductor wire bond die is possible through solderable test protrusion 20 without direct physical contact of the test device to wire bond pad 28 or to upper surface 17 of conductive strap 16. Also, because conductive strap 16 preferably covers the entire upper surface 29 of wire bond pad 28 and has an upper surface 17 itself, subsequent wire bond electrical connection to wire bond pad 28 can be made through upper surface 17 of conductive strap 16.

Conductive strap 16 extends from wire bond pad 28, up sloped surface 18, and laterally across final passivation layer 12. Conductive strap 16 terminates thereon preferably at an end 22 disposed beneath test protrusion 20 at a point laterally displaced from wire bond pad 28. Test protrusion 20 resides directly on conductive strap 16, and preferably, on a portion of final passivation layer 12 adjacent to conductive strap 16.

Conductive strap 16 has a tapered width from a middle section 30 to end 22 beneath test protrusion 20. This tapering allows increased adherence of test protrusion 20 to final passivation layer 12. Because test protrusion 20 is preferably not removed from the semiconductor wire bond die after testing, good adherence of test protrusion 20 to the semiconductor wire bond die is important to prevent inadvertent detachment of the test protrusion during testing, burning in, dicing, or packaging.

The width of middle section 30 of conductive strap 16 is shown narrower than that covering wire bond pad 28. However, middle section 30 may have any width and is not limited to a width less than that contacting wire bond pad 28 or greater than that at end 22.

As shown in FIG. 2, additive test structure 11 of the present invention is disposed above a semiconductor wire bond die comprising a semiconductor substrate having a region of active circuitry 24 associated therewith, metallization levels 26 electrically connected to active circuitry region 24, and wire bond pad 28 disposed above metallization levels 26. Wire bond pad 28 is electrically connected to active circuitry region 24 through metallization levels 26. Wire bond pad 28 has an upper surface 29 above the lower metallization levels.

An adhesive conductive film 23 comprising a layer or layers of a conductive metal may be interposed between solderable test protrusion 20 and conductive strap 16 and between solderable test protrusion 20 and exposed surface 15 of final passivation layer 12 in order to increase adherence of solderable test protrusion 20 thereto. Preferably, a first layer of chromium or titanium is used which is known to adhere well to the aforementioned passivation layers. However, solderable metals, such as those used to form solderable test protrusion 20, do not adhere well to chromium or titanium. Thus, in addition, a metallic layer or layers which adhere well to the underlying chromium or titanium first layer and solderable test protrusion 20 are interposed between solderable test protrusion 20 and the first layer to facilitate adherence. Preferably, a layer of copper on the chromium or titanium first layer, followed by a layer of gold on the copper layer is used. However, the present invention is not limited to the use of the aforementioned metals, and additional metals that may be used to form an adhesive conductive film will be obvious to those skilled in the art.

Figure 3A:
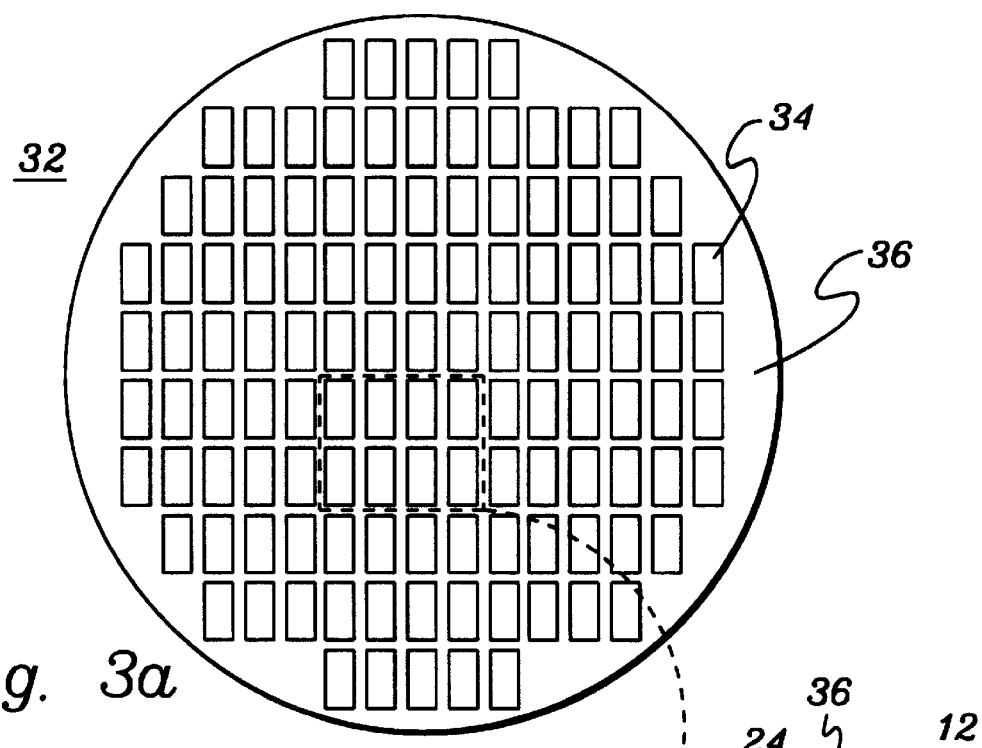
FIG. 3a is a plan view of a semiconductor wafer having a plurality of semiconductor wire bond dies defined therein.

FIG. 3a is a top plan view of a semiconductor wafer 32 comprised of a plurality of semiconductor wire bond dies 34. Surrounding each semiconductor wire bond die 34 is a kerf region 36.

Figure 3B:
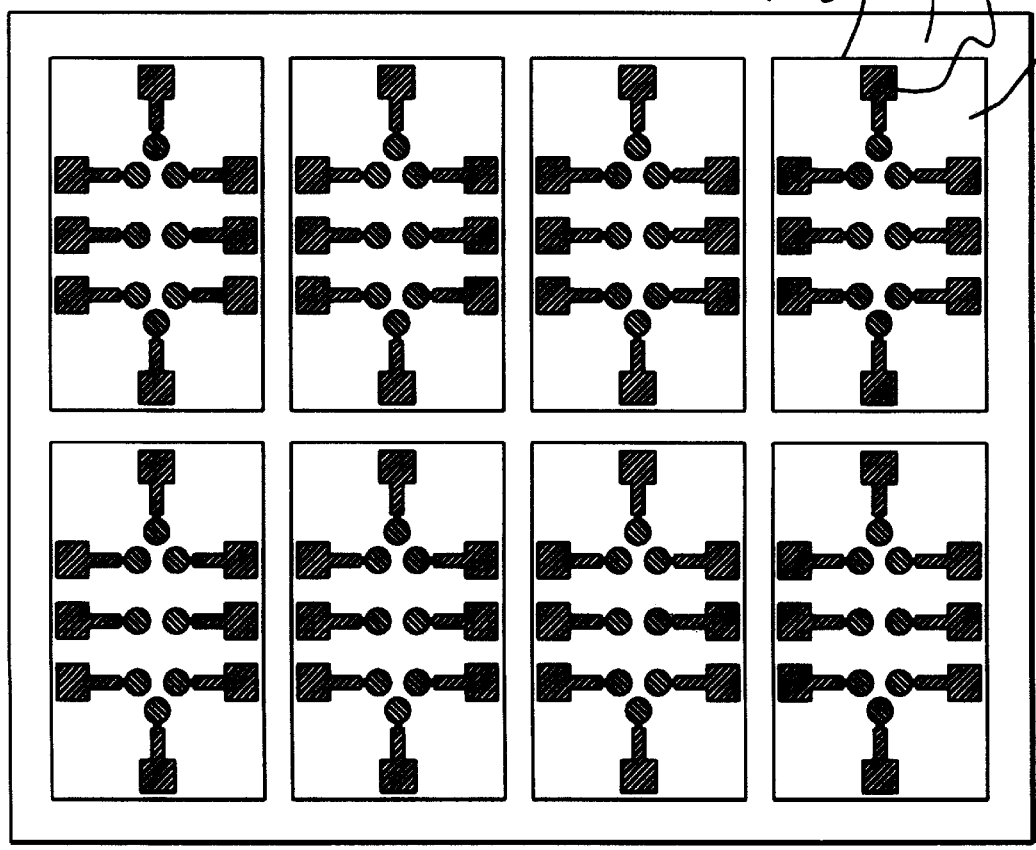
FIG. 3b is an enlarged plan view of a portion of FIG. 3a, illustrating two rows, each row comprising a series of four semiconductor wire bond dies.

FIG. 3b is an enlarged view of FIG. 3a illustrating two rows, each of a series of four semiconductor wire bond dies 34. The underlying region of active circuitry is contained within boundary 35 of each wire bond die 34, with kerf region 36 surrounding each die 34. A plurality of additive test structures 11 reside on each semiconductor wire bond die 34, with each additive test structure being connected to a corresponding wire bond pad. Additive test structures 11 are spaced apart so as to be electrically isolated. Each additive test structure 11 is disposed entirely over the active circuitry of the die such that dicing through kerf 36 may be done without severing any additive test structure 11. Thus, additive test structures 11 may remain on the semiconductor wire bond dies without impacting circuit performance upon dicing. Each individual wire bond die 34 diced from wafer 32 forms a semiconductor wire bond chip that will have a plurality of additive test structures 11 thereon.

The method for testing a semiconductor wire bond die in accordance with the present invention includes forming the above-discussed additive test structure 11. Generally, conductive strap 16 of structure 11 is formed on the die by depositing a metallization layer, e.g., comprising a layer of aluminum or a layer of aluminum over a layer of titanium, onto exposed surface 15 of final passivation layer 12. The metallization layer is then patterned employing available techniques, such as additive lift-off or reactive-ion-etching. The metallization layer is deposited to a thickness sufficient for conductive strap 16 to overlay sloped upper surface 18. For example, where aluminum over titanium is used as the metallization layer, an aluminum layer having a thickness of about $4\mu$ on a layer of titanium having a thickness of about 1000 Å is sufficient.

Solderable conductive test protrusion 20, such as a solder ball or gold bump, is then formed on conductive strap 16, adjacent end 22 and on final passivation layer 12. However, conductive adhesive film 23 may be deposited prior to formation of solderable conductive test protrusion 20 to aid in adhesion of solderable conductive test protrusion 20 to final passivation layer 12.

Testing of die circuitry is performed after electrically connecting an external testing connector (not shown) directly to solderable test protrusion 20. Testing includes, but is not limited to, burning-in of the semiconductor wire bond die followed by full functionality ac testing. After testing, the external test connector is removed from solderable test protrusion 20.

As stated above in relation to FIGS. 3a and 3b, dicing of individual semiconductor wire bond dies 34 from wafer 32 may be done after testing without removing additive test structures 11 from dies 34. This is because the entire additive test structure 11 of the invention resides above the active circuitry of the die and does not extend into wafer kerf area 36. Therefore, dicing through kerf area 36 does not cut through any portion of additive structure 11 exposing die circuitry, and the need for removal of the added elements of structure 1 is eliminated. Subsequent wire bond electrical connection to wire bond pad 28 is facilitated through provision of an upper surface 17 on conductive strap 16.

The method of the invention can also include fabricating the semiconductor wire bond die to be tested. As shown in FIG. 2, active circuitry 24 is defined in a semiconductor substrate along with a plurality of wire bond pads 28 electrically connected thereto through metallization levels 26. A final passivation layer 12 comprising a polyimide, silicon dioxide, or silicon nitride is then formed above the active circuitry 24 and metallization levels 26, and a plurality of apertures 13 is etched through final passivation layer 12 exposing each wire bond pad 28. Additive test structure 11 is then formed on exposed surface 15 of final passivation layer 12 and on upper surface 29 of wire bond pad 28.

Figure 4:
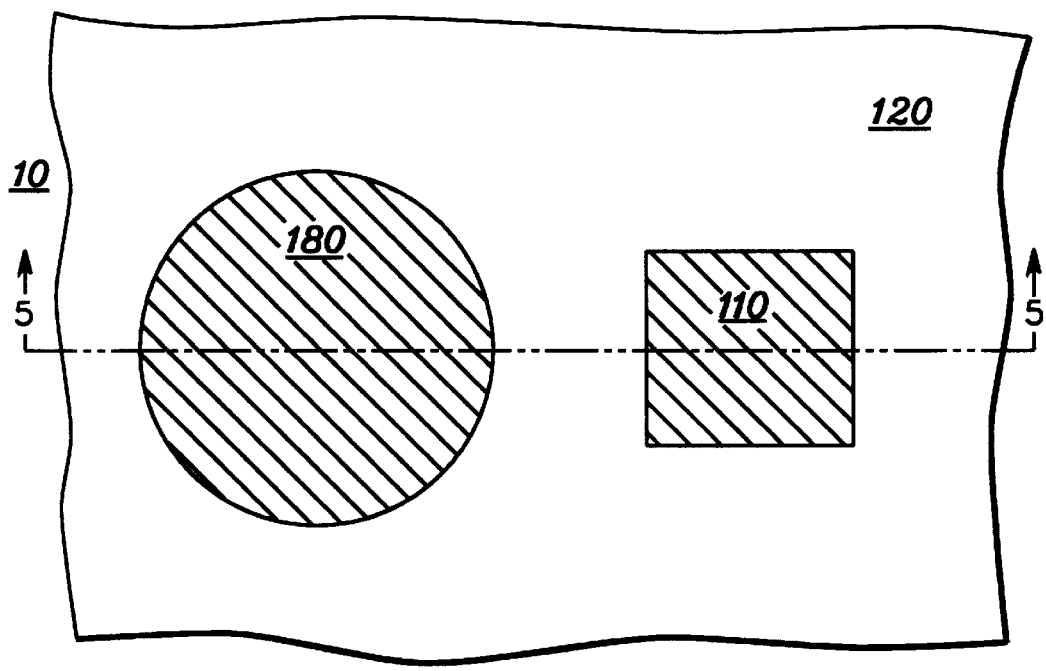
FIG. 4 is a top plan view of a portion of a semiconductor structure illustrating a wire bond pad and corresponding metal bump for external electrical connection thereto in accordance with the present invention.

FIG. 4 shows a top plan view of a portion 10 of a semiconductor structure having wire bond pad 110 and metal bump 180 laterally displaced therefrom, both being capable of electrical connection with an external connector (not shown). Insulating material film 120 is disposed over and protects underlying final metallization (not shown) leaving wire bond pad 110 and metal bump 180 exposed.

The term "metal bump", as used herein, refers to a conductive contact on the final metallization which is preferably a protruding conductive metal configured to facilitate electrical connection to an external connector such as that provided in ceramic modular packaging or used in high performance testing or burn-in. Examples of techniques used to provide electrical connection between the metal bump and an external connector include, but are not limited to, thermal compression and soldering with a metal alloy. A bump such as a gold bump, aluminum bump, or solder ball comprised of lead and tin is preferred, and a controlled collapse chip connect (C4) type solder ball comprising lead and tin may be used.

Figure 5:
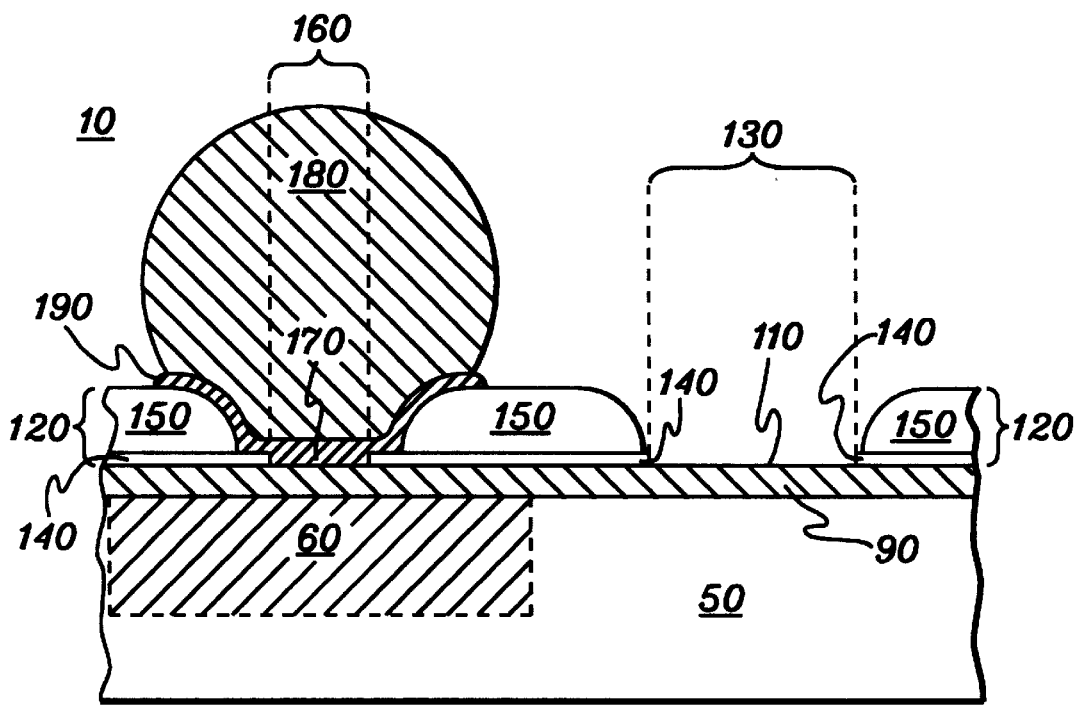
FIG. 5 is a cross section of the structure of FIG. 4 taken along lines A—A.

FIG. 5 is a cross section of the structure of FIG. 4 taken along lines A—A. The semiconductor structure includes semiconductor substrate 50 having region of active circuitry 60 therein. Final metallization 90, comprised of a conductive metal, such as aluminum, aluminum doped with copper, aluminum over titanium, or tungsten, for example, overlies semiconductor substrate 50 and is electrically connected to region of active circuitry 60. Final metallization 90, which includes wire bond pad 110, is not limited to the aforementioned metals, and other conductive metals that may be used will be obvious to those skilled in the art.

Insulating material film 120 is disposed over final metallization 90, leaving wire bond pad 110 exposed through contact hole 130 defined in insulating material film 120. Insulating material film 120 is typically comprised of an insulator such as silicon nitride, silicon dioxide, or polyimide. Preferably, insulating material film 120 will include underlying dielectric layer 140 comprised of one of the aforementioned insulators and final passivation layer 150 disposed over dielectric layer 140 and comprised of a different insulator. For example, insulating material film 120 may be comprised of a layer 140 of silicon nitride with layer 150 of polyimide disposed thereon.

Via hole 160, laterally displaced from contact hole 130, exposes portion 170 of final metallization 90, which is laterally displaced from wire bond pad 110. Metal bump 180 resides in via hole 160, contacting exposed portion 170 of underlying fnal metallization 90. To increase adherence, metal bump 180 is also preferably disposed partially on insulating material film 120 adjacent via hole 160 such that metal bump 180 physically adheres to insulating material film 120.

Wire bond pad 110 and metal bump 180 are laterally displaced and electrically coupled through final metallization 90. Both wire bond pad 110 and metal bump 180 are electrically interconnected with region of active circuitry 60 and are configured to facilitate electrical connection with an external connector (not shown). Thus, either wire bond pad 110 or metal bump 180 may be used to electrically connect active circuitry 60 of semiconductor substrate 50 with an external connector or substrate.

As stated above, insulating material film 120 is positioned over final metallization 90 except where wire bond 110 and portion 170 are exposed. Thus, the section of final metallization 90 that electrically couples and is physically located between wire bond pad 110 and metal bump 180 is covered with and protected by insulating material film 120 (see also FIG. 4). By contrast, in the additive test structure described above and shown in FIGS. 1 through 3, conductive strap 16, the metal strip that physically and electrically connects solderable test protrusion 20 and wire bond pad 28, is disposed over the insulator, final passivation layer 12. Bonding of conductive strap 16 to underlying final passivation layer 12 is weak, and therefore, the additive test structure may be easily removed by accidental mechanical vibrations to the semiconductor structure on which it is attached. Electrical connection between solderable test protrusion 20 and the underlying active circuitry is unreliable, precluding use of solderable test protrusion 20 for making permanent electrical connections from a semiconductor chip to an external substrate, such as a modular package. However, by covering and protecting final metallization 90 in the dual connector structure of the present invention, a physically strong and reliable electrical connection is made between metal bump 180 and region of active circuitry 60. A structure is therefore provided that is reliable and useable for production purposes in which permanent external electrical connections to active circuitry 60 through metal bump 180 are desired.

Adhesive conductive film 190 is preferably interposed between metal bump 180 and insulating material film 120 and between metal bump 180 and exposed portion 170 of final metallization 90. Adhesive conductive film 190, more fully described above in relation to the solderable test protrusion of the additive test structure, is a layer or layers of a conductive metal provided to increase adhesion of metal bump 180 to insulating material film 120 and final metallization 90. Preferably, a first layer of chromium or titanium is used, followed by a layer of copper on the first layer, and a layer of gold on the copper layer.

Figure 6A:
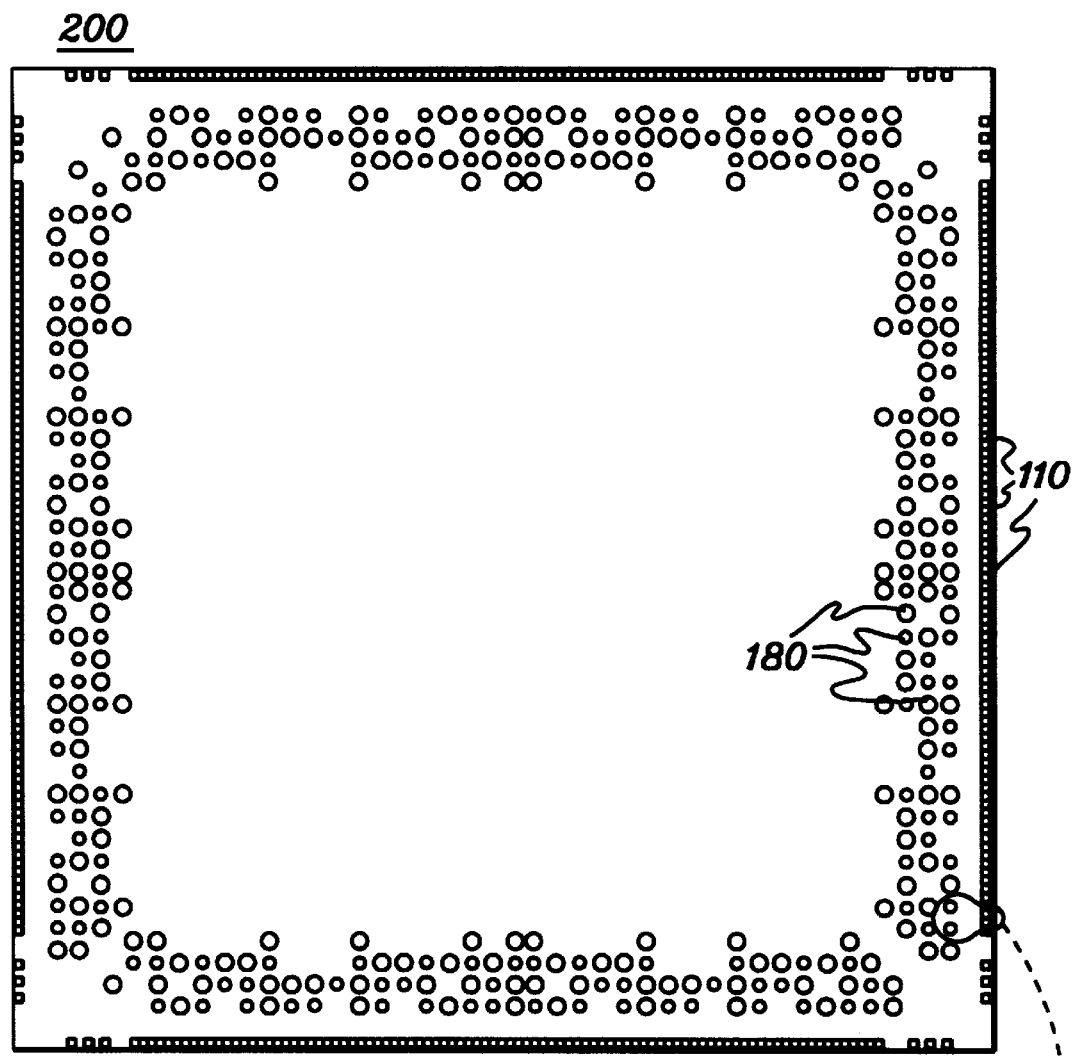
FIG. 6a is a top plan view of a semiconductor die having a plurality of wire bond pads and a plurality of corresponding metal bumps for alternative electrical connection of an external connector thereto.
Figure 9:
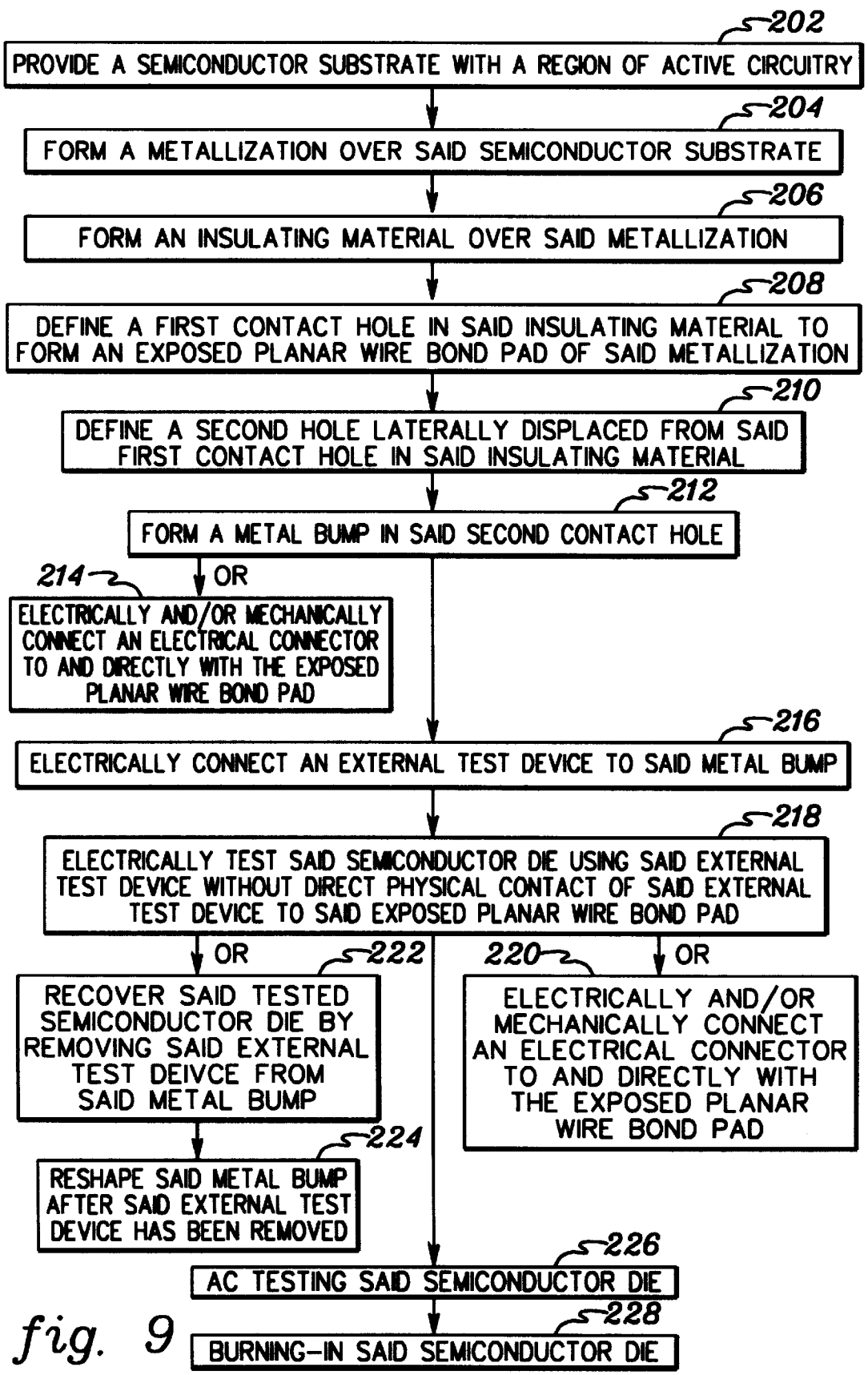
FIG. 9 is a flow diagram illustrating steps for fabricating, testing and using the preferred semiconductor die structure.

In a preferred embodiment, the semiconductor structure is a semiconductor wafer die that, upon severance from the wafer, can be electrically connected and mounted as a chip to an external device such as a plastic or ceramic package. FIG. 6a shows a top plan view of a semiconductor die 200 having a plurality of wire bond pads 110 and a plurality of metal bumps 180 therein configured for electrical connection to an external device (not shown). Each wire bond pad 110 is electrically coupled to a corresponding metal bump 180 having identical function. For practical reasons, wire bond pads 110, indicated as squares, are typically located around the periphery of semiconductor die 200 to facilitate, upon severance from the wafer, connection of an external metal bonder and wire 195 (FIG. 9), for example, to wire bond pad 110 using as short a wire as possible (FIG. 9). In addition, this periphery location is conventionally outside the region of active circuitry to avoid circuitry damage from pressure applied to the pad during wire attachment. Metal bumps 180, shown as large and small circles, are generally positioned away from wire bond pads 110 toward the center of die 200. The distance of bumps 180 from the periphery of die 200 is not critical because no wires are necessary for connection of bumps 180 to an external substrate. In addition, bumps 180 may be formed over the active circuitry because no damaging pressure is applied thereto during connection. Thus, the location of each metal bump 180 is not critical to the invention, and each may be formed anywhere on the die, including between the periphery of the die and its corresponding wire bond pad 110 so long as wire connections to wire bond pad 110 remain feasible.

Figure 6B:
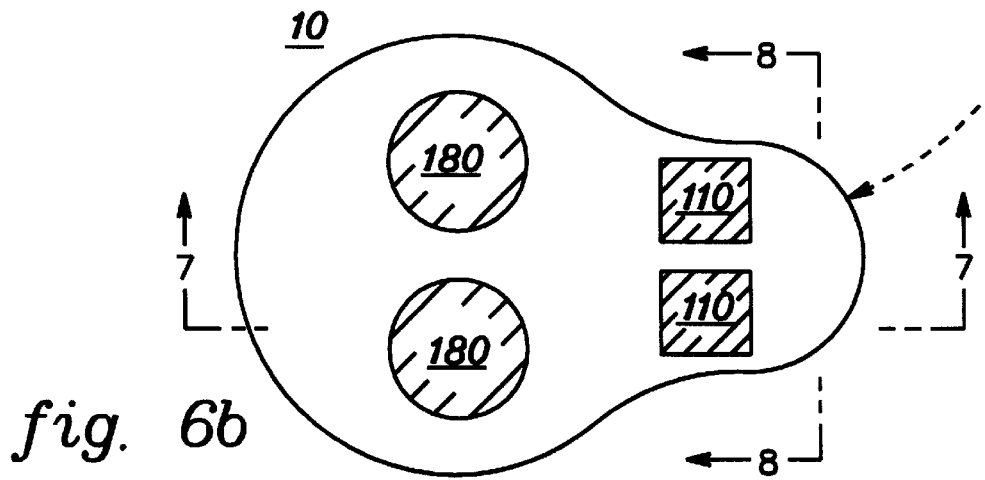
FIG. 6b is an enlarged plan view of a portion of FIG. 6a, illustrating two wire bond pads and corresponding metal bumps.
Figure 7:
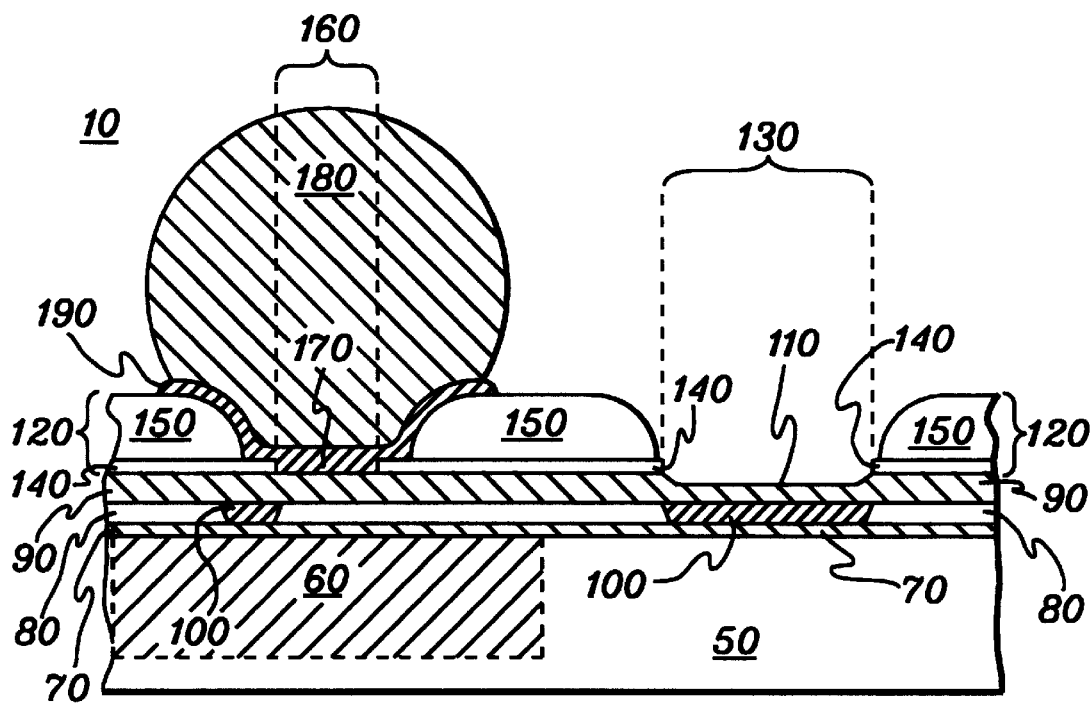
FIG. 7 is a cross section of the structure of FIG. 6b taken along lines A—A illustrating the preferred semiconductor die structure.

FIG. 6b is an enlarged view of FIG. 6a illustrating two adjacent wire bond pads 110 with corresponding metal bumps 180 electrically coupled thereto. FIG. 7 is a cross section of FIG. 6b taken across lines A-A showing a portion 10 of semiconductor wire bond die 200 with one wire bond pad 110 and its corresponding metal bump 180. Portion 10 of the semiconductor die includes semiconductor substrate 50 having region of active circuitry 60 therein. Metallization level 70 is disposed above and electrically coupled to active integrated circuitry 60 of the die. Dielectric layer 80 comprising an insulating material such as silicon dioxide, silicon nitride, or polyimide, for example, is disposed over metallization level 70.

Figure 8:
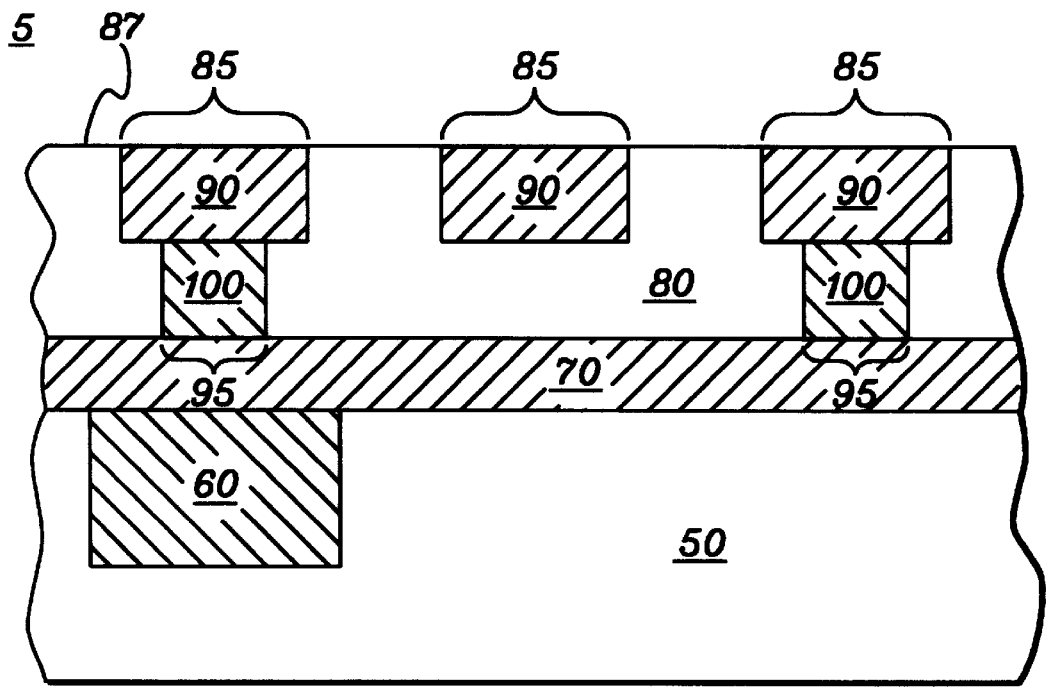
FIG. 8 is a cross section of the structure of FIG. 6b taken along lines B—B illustrating the semiconductor die structure underlying the insulating material film.

FIG. 8 is a cross-sectional view of the portion of the semiconductor die of FIG. 6b taken across lines B-B perpendicular to the view shown in FIG. 7. FIG. 8 illustrates a portion 5 of the semiconductor die structure beneath insulating material film 120. The conductive metal of final metallization 90 described above preferably fills a plurality of spaced grooves 85 in upper surface 87 of dielectric layer 80 forming a plurality of final metallization lines. The term "final metallization line" is used herein to refer to final metallization 90 in the preferred semiconductor die embodiment, and the same reference sign "90" will be used for each. At least two grooves 85 have an aperture 95 extending to and exposing underlying metallization 70. Each aperture 95 is also filled with the conductive metal to form a plurality of studs 100 (shown also in FIG. 7), wherein each stud 100 electrically connects a corresponding final metallization line 90 with region of active circuitry 60 through metallization level 70. Referring again to FIG. 7, each final metallization line 90 has included therein a wire bond pad 110 defining a plurality of wire bond pads 110 electrically coupled to region of active circuitry 60 through corresponding final metallization lines 90, studs 100, and metallization level 70.

Insulating material film 120 covers each metallization line 90 of the plurality of metallization lines 90, leaving a corresponding wire bond pad 110 exposed through a contact hole 130. The semiconductor die has a plurality of such contact holes 130, each exposing a wire bond pad 110. In addition, a plurality of via holes 160, each corresponding to and laterally displaced from contact hole 130, expose portions 170 of underlying metallization lines 90, and each exposed portion 170 is laterally displaced from corresponding wire bond pad 110.

Metal bump 180 resides in and contacts each exposed portion 170 of a corresponding metallization line 90 forming a plurality of metal bumps 180. Each metal bump 180 is laterally displaced from and electrically interconnected to a corresponding wire bond pad 110 through its corresponding metallization line 90. Each wire bond pad 110 and metal bump 180 is configured to provide electrical connection of an external electrical connector (not shown) to region of active circuitry 60 of the semiconductor die. Thus, either wire bond pads 110 or metal bumps 180 may be used to electrically join the severed chip to a substrate in the next level of manufacturing.

The alternative connector structural design of the semiconductor die of the present invention described above also permits testing and burning in the die without physical contact of an external test device, such as a probe, to wire bond pad 110. Thus, damage, such as surface defects and scratches in wire bond pad 110 caused by physical contact of the test device can be avoided. Reference to FIG. 5 may also be made to illustrate the elements of the test structure. Auxiliary testing terminal (indicated as 180) in via hole 160 is preferably a metal bump as described above. However, other testing structures that can be adhered to final metallization 90 may be used and will be obvious to those skilled in the art. Auxiliary testing terminal 180 contacts final metallization 90 and is electrically coupled with wire bond pad 110. In addition, auxiliary testing terminal 180 is configured to facilitate connection of an device 175 (FIG. 9) thereto such that electrical testing and burning in the semiconductor die can occur through the structure without direct physical contact of the external test device to wire bond pad 110 (FIG. 9).

The method for fabricating a semiconductor die capable of facilitating external electrical connection through either wire bond pad 110 or metal bump 180 includes providing semiconductor substrate 50 with region of active circuitry 60 therein, shown in FIGS. 5 and 7. Final metallization 90 including wire bond pad 110 is formed over semiconductor substrate 50, typically using conventional masking and etching techniques followed by evaporation of a conductive metal therein. The conductive metal is preferably aluminum doped with copper, but may be aluminum, aluminum over titanium, or tungsten, for example. However, other conductive metals may be used as will be obvious to those skilled in the art. When aluminum doped with copper is used as final metallization 90, a thickness of about $2\mu$ is typically applied.

Wire bond pad 110 is electrically connected to region of active circuitry 60 through final metallization 90 and is configured to facilitate external electrical connections thereto, such as by a metal bonder and wire. Inter-level dielectric layer 80, comprising an insulator such as silicon dioxide, silicon nitride, or polyimide, is typically deposited to a thickness of about $1.5\mu$ over an underlying metallization level 70 having a thickness of about $1\mu$. Inter-level dielectric layer 80 is then defined using masking and etching techniques prior to formation of final metallization 90. Inter-level dielectric layer 80 separates metallization level 70 from final metallization 90.

Insulating material film 120, as described above, is then formed as a layer over final metallization 90. Typically, a layer of silicon nitride having a thickness of about $1\mu$ is deposited. However, more preferably, a layer of polyimide having a thickness of between about 4 and $6\mu$ is formed over the nitride layer to provide extra protection for the underlying metallization. Contact hole 130, exposing wire bond pad 110, and via hole 160, laterally displaced from contact hole 130, are defined in insulating material film 120, typically by masking and etching techniques. Via hole 160 exposes a portion 170 of final metallization 90 that is laterally displaced from wire bond pad 110.

Metal bump 180 is then formed in via hole 160 contacting exposed portion 170 of final metallization 90. In addition, metal bump 180 is preferably formed partially on insulating material film 120 adjacent via hole 160 such that metal bump 180 physically adheres to insulating material film 120. Adhesive conductive film 190, described above, may be deposited prior to formation of metal bump 180 to aid in adhesion of metal bump 180 to insulating material film 120 and final metallization 90. Wire bond pad 110 and metal bump 180 are spaced apart but are electrically coupled through final metallization 90. Also, both are electrically coupled to region of active circuitry 60. External electrical connections to the semiconductor die by an external device can therefore be made to either metal bump 180 or wire bond pad 110.

In addition, the method of the present invention may include full functionality ac testing or burning-in of the fabricated semiconductor die having dual connectors. An external test device (not shown) is electrically and directly connected to metal bump 180 while wire bond pad 110 remains physically uncontacted and undamaged by an external test device such as a probe.

After testing and removal of the external test device, metal bump 180 may be reshaped. The recovered semiconductor die may then be used in either wire bondable or flip-chip packaging upon severance from the wafer.

Metal bump 180 is typically reshaped using a conventional hydrogen reflow process in which the die containing wafer is heated at high temperature in a hydrogen atmosphere, and the metal bump is remelted and reshaped. In addition, during the process, chemical reduction by hydrogen removes any contamination that may be contained on wire bond pad 110. The semiconductor chip severed from the wafer is then useable in either wire bond or flip-chip/metal bump packaging.

FIG. 9 is a flow diagram illustrating steps for fabricating, testing and using the preferred semiconductor die structure described above. Briefly, these steps may comprise the following. Provide a semiconductor substrate with a region of active circuitry, step 202. Form a metallization over said semiconductor substrate, step 204. Form an insulating material over said metallization, step 206. Define a first contact hole in said insulating material to fore an exposed planar wire bond pad of said metallization, step 208. Define a second contact hole laterally displaced from said first contact hole in said insulating material, step 210. Form a metal bump in said contact hole, step 212. Electrically connect an external test device to said metal bump, step 216. Electrically test said semiconductor die using said eternal test device without direct physical contact of said external test device to said exposed planar wire bond pad, step 218. AC test said semiconductor die, stop 226. And, burning-in said semiconductor die, step 228. Alternatively, after step 212, one may electrically and/or mechanically connect an electrical connector to and directly with the exposed planar wire bond pad, step 214. Alternatively, after step 218, one may electrically and/or mechanically connect an electrical wire connector to and directly with the exposed planar wire bond pad, for step 220. Still alternatively, after step 218, one may recover said tested semiconductor die by removing said external test device from said metal bump, step 222. Then, reshape said metal bump after said external test device has been removed, step 224.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for fabricating a semiconductor die that combines two different exposed electrical contacts and facilitates electrical connection of an external connector to at least one of said exposed electrical contacts, said method comprising the steps of:

(a) providing a semiconductor substrate with a region of active circuitry;

(b) forming a metallization over said semiconductor substrate, said metallization electrically coupled to said region of active circuitry;

(c) forming an insulating material over said metallization;

(d) defining a first contact hole in said insulating material to form an exposed planar wire bond pad of said metallization, wherein when processing of said semiconductor die is complete said exposed planar wire bond pad of said metallization is exposed to facilitate wire bond connection of the external connector comprising an external wiring to the exposed planar wire bond pad; and (e) defining a second contact hole laterally displaced from said first contact hole in said insulating material, said second contact hole exposing a portion of said metallization laterally displaced from and electrically connected to said exposed planar wire bond pad, and forming a metal bump in said second contact hole, said metal bump contacting said exposed portion of said metallization and being disposed above said region of active circuitry of the semiconductor die, wherein electrical connection to said semiconductor substrate can occur through either said exposed planar wire bond pad or said metal bump.

2. The method according to claim 7, in combination with a method of testing said fabricated semiconductor die, said method comprising the steps of:

(f) electrically connecting an external test device to said metal bump; and (g) electrically testing said semiconductor die using said external test device without direct physical contact of said external test device to said exposed planar wire bond pad and wherein said exposed planar wire bond pad remains undamaged for subsequent electrical connection to said exposed planar wire bond pad.

3. The method according to claim 2, wherein said testing step (h) comprises ac testing said semiconductor die.

4. The method according to claim 3, further comprising the step of burning-in said semiconductor die.

5. The method according to claim 2, in combination with a method of recovering said tested semiconductor die, said method comprising the additional step of removing said external test device from said metal bump.

6. The method according to claim 5, further comprising the step of reshaping said metal bump after said external test device has been removed.

7. The method according to claim 1, wherein said forming step (b) comprises forming said metallization over said semiconductor substrate such that said exposed planar wire bond pad is disposed at a periphery of said semiconductor die.

8. The method according to claim 1, wherein said forming of said metal bump in said second contact hole comprises forming said metal bump to have a contact area greater than a contact area of said exposed planar wire bond pad formed in said step (b).

9. The method according to claim 2, further comprising the step of electrically connecting an electrical wire connector to the exposed planar wire bond pad for electrical connection of the electrical connector to the semiconductor die.

10. The method according to claim 7, further comprising the step of electrically connecting an electrical wire connector to the exposed planar wire bond pad for electrical connection of the electrical connector to the semiconductor die.

11. A method for fabricating a semiconductor die that combines two different exposed electrical contacts and facilitates electrical connection of an external connector to at least one of said exposed electrical contacts, said method comprising:

(a) providing a semiconductor substrate with a region of active circuitry;

(b) forming a metallization over said semiconductor substrate, said metallization electrically coupled to said region of active circuitry;

(c) forming an insulating material over said metallization;

(d) defining a first contact hole in said insulating material to form an exposed planar wire bond pad of said metallization, wherein when processing of said semiconductor die is complete said exposed planar wire bond pad facilitating electrical and mechanical connection of an external wiring to and directly with said exposed planar wire bond pad of said metallization; and (e) defining a second contact hole laterally displaced from said first contact hole in said insulating material, said second contact hole exposing a portion of said metallization laterally displaced from and electrically connected to said exposed planar wire bond pad, and forming a metal bump in said second contact hole, said metal bump contacting said exposed portion of said metallization and being disposed above said region of active circuitry of the semiconductor die, wherein electrical connection to said semiconductor substrate can occur through either said exposed planar wire bond pad or said metal bump.

12. The method according to claim 11, wherein said forming step (b) comprises forming said metallization over said semiconductor substrate such that said exposed planar wire bond pad is disposed at a periphery of said semiconductor die.

13. The method according to claim 12, in combination with a method of testing said fabricated semiconductor die, said method comprising:

(f) electrically connecting an external test device to said metal bump; and (g) electrically testing said semiconductor die using said external test device without direct physical contact of said external test device to said exposed planar wire bond pad and wherein said exposed planar wire bond pad remains undamaged for subsequent electrical connection to said exposed planar wire bond pad.

14. The method according to claim 13, further comprising electrically connecting an electrical wire connector to the exposed planar wire bond pad for electrical connection of the electrical connector to the semiconductor die.

15. A method for fabricating a semiconductor die that combines two different exposed electrical contacts and facilitates electrical connection of an external connector to at least one of said exposed electrical contacts, said method comprising:

(a) providing a semiconductor substrate with a region of active circuitry;

(b) forming a first metallization over said semiconductor substrate, said first metallization electrically coupled to said region of active circuitry;

(c) forming an insulating material over said first metallization;

(d) defining a first contact hole in said insulating material and a second contact hole in said insulating material laterally displaced from said first contact hole, wherein electrical connection to said semiconductor substrate can occur through either said first or second contact holes; and (e) forming a second metallization over said first metallization in at least one of said first contact hole and said second contact hole wherein said second contact hole has at least one different metallization composition from that of said first contact hole over said first metallization of said second contact hole and wherein said second contact hole has at least one metallization layer over said first metallization and said first metallization of said first contact hole is exposed.

16. The method according to claim 15, wherein said forming step (b) comprises forming said first metallization over said semiconductor substrate such that said first contact hole is disposed at a periphery of said semiconductor substrate, and wherein said method further comprises forming a metal bump in said second contact hole, said metal bump being disposed above said region of active circuitry of the semiconductor substrate, wherein electrical connection to said semiconductor substrate can occur through either said first contact hole or said metal bump.

17. The method according to claim 16, in combination with a method of testing said fabricated semiconductor die, said method comprising:

(f) electrically connecting an external test device to said metal bump; and (g) electrically testing said semiconductor die using said external test device without direct physical contact of said external test device to said first metallization of said first contact hole and wherein said first metallization of said first contact hole remains undamaged for subsequent electrical connection thereto.

18. The method according to claim 17, wherein said testing step (g) comprises ac testing said semiconductor die.

19. The method according to claim 18, further comprising burning-in said fabricated semiconductor die.

20. The method according to claim 19, further comprising electrically connecting an electrical wire connector to said first metallization of said first contact hole for electrical connection of the electrical connector to the fabricated semiconductor die.

* * * * *

UNITED STATES PATENT AND TRADEMARK OFFICE
CERTIFICATE OF CORRECTION

PATENT NO. : 6,204,074 B1  Page 1 of 1
DATED : March 20, 2001
INVENTOR(S) : Bertolet et al.

It is certified that error appears in the above-identified patent and that said Letters Patent is hereby corrected as shown below:

Column 13,
Line 23, insert -- (FIG. 9) -- after 110

Column 15, claim 9,
Lines 58 & 59, delete "further comprising the" and insert -- in combination with a --
Line 62, delete "." after the word die and insert -- , wherein the step of electrically connecting is performed after fabricating the semiconductor die is complete. --

Column 15, claim 10,
Lines 63 & 64, delete "further comprising the" and insert -- in combination with a --
Line 67, delete "." after the word die and insert -- , wherein the step of electrically connecting is performed after fabricating the semiconductor die is complete. --

Column 16, claim 14,
Lines 48 & 49, delete "further comprising" and insert -- in combination with a step of --
Line 51, delete "." after the word die and insert -- , wherein the step of electrically connecting is performed after fabricating the semiconductor die is complete. --

Column 17, claim 15,
Line 5, delete "at least one of said first contact hole and"
Line 7, insert -- and additional -- after the word "different."
Line 8, delete the word "that of" and insert -- the metallization composition of --

Column 18, claim 20,
Line 16, delete "further comprising" and insert -- in combination with a step of --
Line 20, delete "." after the word die and insert -- wherein the step of electrically connecting is performed after fabricating the semiconductor die is complete. --

Signed and Sealed this

Twelfth Day of March, 2002

Attest:

JAMES E. ROGAN
*Attesting Officer*   *Director of the United States Patent and Trademark Office*